United States Patent [19]

Gabara

[11] Patent Number: 4,947,228

[45] Date of Patent: Aug. 7, 1990

[54] INTEGRATED CIRCUIT POWER SUPPLY CONTACT

[75] Inventor: Thaddeus J. Gabara, Lehigh County, Pa.

[73] Assignee: AT&T Bell Laboratories, Murray Hill, N.J.

[21] Appl. No.: 246,713

[22] Filed: Sep. 20, 1988

[51] Int. Cl.$^5$ ............................................. H01L 27/02
[52] U.S. Cl. .................................... 357/42; 357/23.1; 357/48; 357/86
[58] Field of Search ..................... 357/42, 48, 23.1, 86

[56] References Cited

U.S. PATENT DOCUMENTS

| | | | |
|---|---|---|---|
| 4,572,972 | 2/1986 | Shoji | 307/303 |
| 4,631,570 | 12/1986 | Birritella et al. | 357/49 |
| 4,641,172 | 2/1987 | Iwatani | 357/48 |
| 4,672,584 | 6/1987 | Tsuji et al. | 365/226 |
| 4,675,717 | 6/1987 | Herrero et al. | 357/71 |
| 4,684,973 | 8/1987 | Takano et al. | 357/68 |

OTHER PUBLICATIONS

Electronics, "Pinout Fuss Yields Quieter Fast CMOS", Nov. 12, 1987, by J. Robert Lineback, pp. 32–33.

Primary Examiner—Edward J. Wojciechowicz
Attorney, Agent, or Firm—James H. Fox

[57] ABSTRACT

An integrated circuit formed on a substrate has field effect transistors formed in relatively lightly doped (i.e., high resistivity) epitaxial layer, typically in a "tub" formed therein. Operating current for the transistors is provided at least in part through a metallic layer on the back side of the substrate. Surprisingly, the conductivity is sufficiently high through the epitaxial layer and the substrate that the number of power supply bondpads on the front side may be reduced, or eliminated entirely in some cases. In addition, a reduction in power supply lead inductance is obtained, reducing ringing and ground bounce problems.

19 Claims, 2 Drawing Sheets 4,947,228

INTEGRATED CIRCUIT POWER SUPPLY CONTACT

BACKGROUND OF THE INVENTION

1. Field of the Invention

The present invention relates to an improved method of providing an electrical power contact to an integrated circuit.

2. Description of the Prior Art

In order to provide an electrical power contact (e.g., $V_{DD}$ or $V_{SS}$) to integrated circuits, a power conductor is routed around the "front" side of the chip; i.e, the side on which the field effect devices are formed. The power conductor connects the devices to a bondpad from which a wire lead connects to an integrated circuit package terminal, for connection to an external power supply. At least one power conductor, or "bus" is provided for each power supply voltage. To minimize inductance and resistance, usually several bonding pads are provided to connect a given bus with the package power supply terminals. For example, in one current microprocessor design, 15 $V_{SS}$ bondpads must be provided out of a total of 130 bondpads. In many cases the integrated circuit chips have now become "bondpad limited", with the periphery of the chip supporting the maximum number of bondpads possible. Hence, the large number of power supply bondpads reduce the number available for other purposes, such as signal inputs and outputs.

With high speed integrated circuits, an additional concern relates to electrical noise generated when output buffers turn on or off. Such switching noise voltages are due in part to the rapid change in current flow through the power supply conductors, which causes switching noise voltages to occur due to ohmic voltage drop across the resistance of the conductor, and to the inductive voltage produced by the inductance of the conductor. Such noise voltages can interfere with the other signals internal to the integrated circuit, or with the output signals from other output buffers. In particular, the change in current through the ground ($V_{SS}$) power supply conductor causes "ground bounce" noise to be generated, wherein the internal ground potential bounces with respect to the external ground. The ground bounce noise is known to be caused in significant part by the switching of the output buffers, since they momentarily draw a relatively large current in order to charge up the capacitance of the external output lead to which they are connected. In some cases, a bus has been split into two or more portions connected to different areas of the integrated circuit, in an attempt to isolate the noise generated in one area from affecting devices in another area.

It is known to use conduction through a highly doped (e.g., low resistivity) substrate for making contact to a power supply. As discussed in U.S. Pat. No. 4,631,570, bipolar devices may be supplied with a positive power supply voltage ($V_{CC}$) by a metallic contact on the back side of an integrated circuit chip. This allows contacting a buried collector region that is formed in an epitaxial layer on the substrate. However, the high resistivity of the epitaxial layer prevents the power supply voltage $V_{CC}$ from being supplied to devices located on the top surface (front) of the chip. For example, a resistor requires a separate surface contact thereto. This illustrates the fact that workers in the integrated circuit art have not considered it feasible to make a power supply contact from the backside of a chip through an epitaxial layer. This is due to the much higher resistivity (typically over an order of magnitude higher) of the epitaxial layer as compared to the substrate. It is also known to metallize the back side of an integrated circuit chip in order to provide a heat sink. For CMOS integrated circuits formed on a p+ substrate, the metal layer is typically connected to ground ($V_{SS}$), in order to provide a bias that helps reduce latch-up. However, no significant current (i.e., no channel current) is intended to flow through this contact.

CMOS integrated circuits are frequently formed on semiconductor substrates that have an epitaxial layer. In most cases, the p and n channel devices are formed in doped "tub" regions located in the epitaxial layer. The epitaxial layer, formed by deposition onto a single crystal semiconductor wafer, is usually much less heavily doped than the wafer, with the tubs having a doping level intermediate between that of the wafer and the epitaxial layer. Hence, the epitaxial layer has a much higher resistivity than the wafer. This has led workers in the CMOS art to take great care to include a sufficient number of power supply bondpads on the front side of the chip to ensure that the above-noted "ground bounce" does not limit circuit performance. In practice, the number of $V_{SS}$ and $V_{DD}$ power supply bonding wires (and hence bondpads) is chosen based upon a calculation of the maximum inductance that can be tolerated for acceptable ground-bounce performance.

SUMMARY OF THE INVENTION

I have invented a technique for supplying a power supply voltage to an integrated circuit having field effect devices formed in a tub located in a lightly doped epitaxial layer on a more heavily doped substrate. A conductive (e.g., metal) layer on the back side of an integrated circuit substrate is connected to a power supply terminal. In operation, power supply current is provided to the source electrodes of field effect devices through the substrate. The epitaxial layer typically has a resistivity at least 100 times greater than the substrate. Surprisingly, fewer power supply bondpads are required than called for by prior art design techniques. The bondpads may even be eliminated for a given power supply voltage in some cases.

DETAILED DESCRIPTION

The present detailed description relates to CMOS integrated circuits having a power supply voltage conducted to field effect devices formed in a tub located in a relatively lightly doped epitaxial layer formed on a more heavily doped substrate. Surprisingly, I have found that conduction through the lightly doped (i.e., higher resistivity) substrate can be sufficient to provide the channel current for device operation. This is the case even when the doping level of the epitaxial layer is over two orders of magnitude less than the substrate, so that the resistivity of the epitaxial layer is over 100 times greater than the substrate. In fact, I have found that successful operation may be obtained using an epitaxial layer having a resistivity over 1000 times greater than the substrate (e.g., having a doping level over 1000 times less). I have also surprisingly found that latch-up suppression of a CMOS integrated circuit is not impaired by the present technique, even though large currents flow vertically through the substrate. In addition, power supply bounce, and hence noise, is typically reduced, due to reduced lead inductance.

Figure 1:
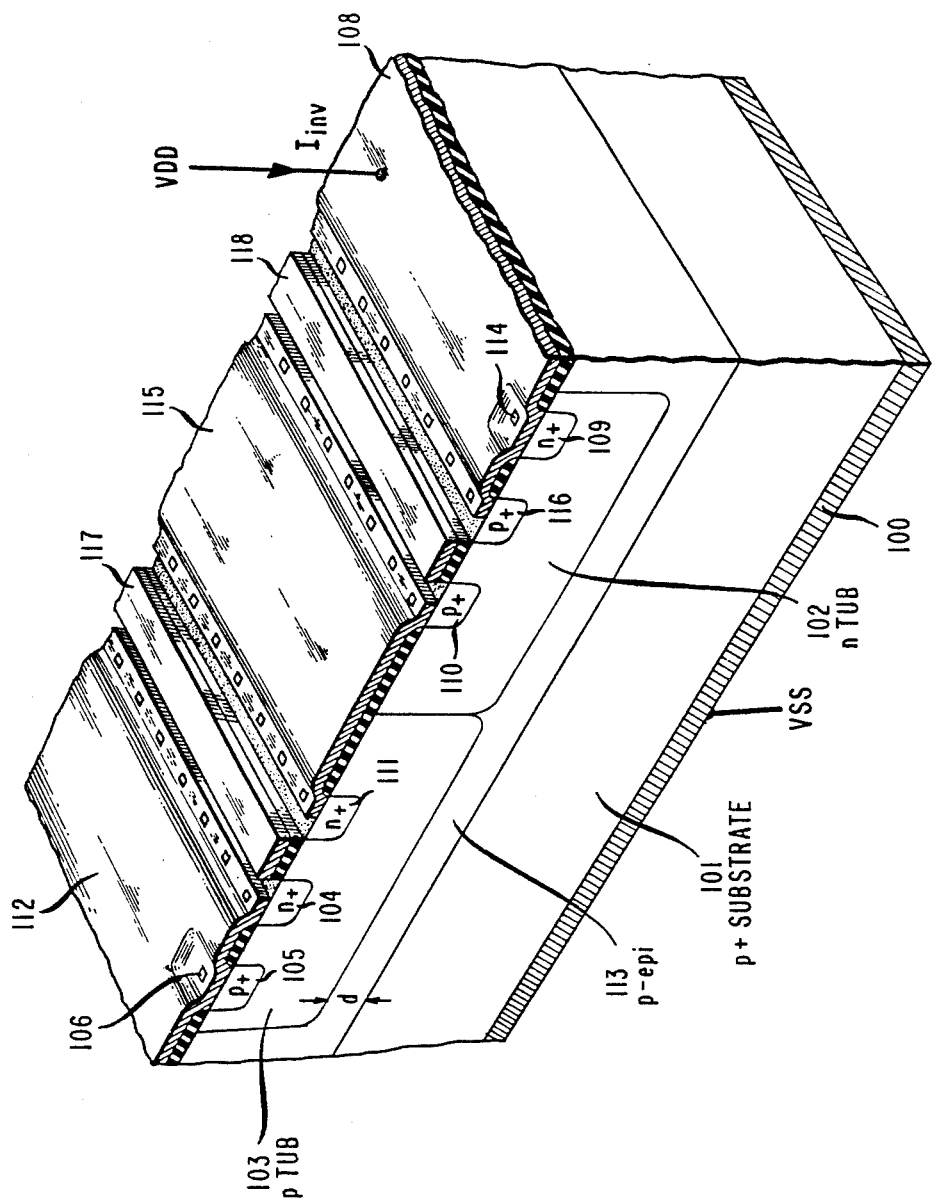
FIG. 1 shows a cross section of a CMOS integrated circuit having a source region contacted by the inventive technique.

Referring to FIG. 1, an exemplary embodiment of the present technique is shown with a CMOS integrated circuit. A silicon substrate 101 has a metallic layer 100 covering the "back" side of the substrate, which is connected through a package terminal to the negative power supply $V_{SS}$. An epitaxial layer 113 is formed on the "front" side of the substrate; the doping level of the epitaxial layer is significantly less than that of the substrate, resulting in a much higher resistivity. Field effect devices are formed in "tubs", being doped regions located in the epitaxial layer. In particular, the p-channel field effect transistors are formed in the n-tub 102, and the n-channel field effect transistors are formed in the p-tub 103. One technique of producing p and n tubs is given in U.S. Pat. No. 4,554,726, co-assigned with the present invention, with various other techniques being known in the art. The illustrated configuration implements a CMOS inverter, with the drain 111 of the n-channel transistor being connected to the drain 110 of the p-channel transistor by conductor 115. However, other CMOS logic circuits may advantageously use the present technique.

The source region 104 of the n-channel devices is connected to a highly doped tub contact region 105 by means of a conductor 112, forming a "tub-tie". The use of a tub-tie per se is known in the art, for causing the tub to be held at a desired potential, in order to provide a constant back-gate bias. However, that use required practically no DC current conduction, and hence the highly doped contact region is often made minimum size, in order to save space. To implement the present invention for the n-channel transistor, the highly doped tub contact region 105 is desirably made large compared to prior art practice. I recommend that the width and length of region 105 be made approximately equal to that of the overlying power bus (when present). The channel current to the inverter ($I_{inv}$) is then conducted through the contact window 106 to the p-tub with minimal voltage drop. The conductor 112 may be of suitable material for providing a low resistance ohmic contact between the source 104 and the highly doped contact region 105. Typically, the conductor is a metal (e.g., aluminum) that extends through contact widows in an overlying dielectric in order to contact these regions, and may form part of the power (e.g., $V_{SS}$) bus. However, it is also possible to employ a metal silicide to form this tub-tie conductor. The silicide may be formed during the "salicide" process that forms the silicide layer on the gate, source, and drain. In that case, the silicide is located underneath the dielectric layer, and the contact windows may be omitted entirely, unless additional conduction by means of the conventional power supply bus is also desired.

The other regions of FIG. 1 included in the exemplary inverter are the gate electrodes 117 and 118 for the n-channel and p-channel devices, respectively. The source 116 of the p-channel device is connected to the $V_{DD}$ bus 108, which is connected by means of a conventional tub tie window 114 to the n+ tub contact region 109.

In the present technique, the dopant type typically remains the same from the tub contact region (and hence the tub) into the epitaxial layer and substrate. That is, the doping is continuously p-type in the exemplary case, with no reverse-biased p-n junctions being present that would interfere with power supply current conduction. Hence, the current may flow from the source of the n-channel transistors in the p-tub to the p-tub contact region (by means of the ohmic contact provided by the tub tie conductor), and through both the epitaxial layer and substrate to the $V_{SS}$ contact on the back side of the chip. Note that if a n-type substrate were used having a n-type epitaxial layer thereon, then a suitably sized n-tub contact region could be used to provide conduction to the positive ($V_{DD}$) power supply voltage for the p-channel devices. The success of the present technique, against the expectations of workers in the art, appears due to a significant extent to the fact that the tub, which is more highly doped than the epitaxial layer, extends to within a short distance from the epitaxial/substrate interface 107. That is, the distance d in FIG. 1 is small, being typically less than 15 micrometers in present CMOS processes, and less than 5 micrometers in future processes. Hence, the high resistivity of the epitaxial layer does not prevent sufficient current from flowing to allow proper device operation in most cases. In fact, in future generation processes, the distance d may actually go to zero, with the tubs extending down to the interface.

SAMPLE CALCULATION

The resistance of a cross-sectional slab of silicon in the p-tub has been estimated for two CMOS technologies, having nominal linewidths of 0.9 micrometers and 1.25 micrometers, respectively (also referred to as the "0.9 micron technology" and the "1.25 micron technology" herein). The slab had a length of 100 micrometers and a width of 100 micrometers as viewed from the front (top) side of the silicon chip, and extended from the front side to the back side contact. The p+ tub contact region was assumed to cover the entire top surface. For the 0.9 micron technology, the doping level of the p+ substrate was on the order of $1 \times 10^{19}$ per cm$^3$, whereas in the p epitaxial layer it was on the order of $1 \times 10^{15}$ per cm$^3$. The thickness of the epitaxial layer was 7 micrometers for the 0.9 micron technology prior to the tub diffusion. After the tub diffusion, the thickness of the lightly doped epitaxial layer under the tub was about 1 micron. For the 1.25 micron technology, the doping level of the p+ substrate was $1 \times 10^{19}$ per cm$^3$, whereas in the p epitaxial layer it was $5 \times 10^{14}$ per cm$^3$. The thickness of the epitaxial layer was 16 micrometers for the 1.25 micron technology, and after tub diffusion the thickness under the tub was 10 micrometers. Note that for both technologies, the doping level of the epitaxial layer was over 1000 times less than that of the substrate, so that the resistivity of the epitaxial layer was more than 1000 times greater than that of the substrate. The results are listed in the Table below:

TABLE

| RESISTANCE OF LAYERS | | | | | |
|---|---|---|---|---|---|
| Technology | p+ contact | p− tub | p− epi | p+ substrate | Total |
| 0.9 micron | 0.0007 | 2.0 | 24 | 5 | 31 ohms |

TABLE-continued

RESISTANCE OF LAYERS

| Technology | p+ contact | p− tub | p− epi | p+ substrate | Total |
|---|---|---|---|---|---|
| 1.25 micron | 0.0027 | 3.5 | 250 | 4.1 | 262 ohms |

In the case of the 0.9 micron technology, the worst case resistance between the metal $V_{SS}$ bus and the p+ tub contact region is 10 ohms per contact. Thus, if the tub tie contacts are placed once every 20 micrometers, the total contact resistance is 0.4 ohms, which is negligible.

The total resistance between the $V_{SS}$ bus and the metal substrate contact can now be calculated: If a contiguous 100 micron wide $V_{SS}$ bus wraps around the perimeter of a chip having dimensions of 1 cm by 1 cm, then the total area of the bus is $4 \times 10^6$ micrometers$^2$. Since the resistance of a 100 micron by 100 micrometers slab is 31 ohms (Table), the resistance for the above case is 31/400=0.0775 ohms. To calculate the peak voltage drop due to this resistance, assume that the chip's steady state current $I_{DD}$ is 200 milliamps. The total IR drop between the top $V_{SS}$ bus and the metal substrate contact is then $0.2 \times 0.0775 = 0.0155$ volts (15.5 millivolts). In an illustrative case of 32 output buffers each sinking 20 milliamps, then an additional voltage drop of 49.6 millivolts occurs. The total voltage drop is then 65.1 millivolts on current peaks, which is low enough to allow normal chip operation. In the typical case of interfacing with TTL levels, the maximum tolerable voltage noise peak is about 400 millivolts.

Figure 2:
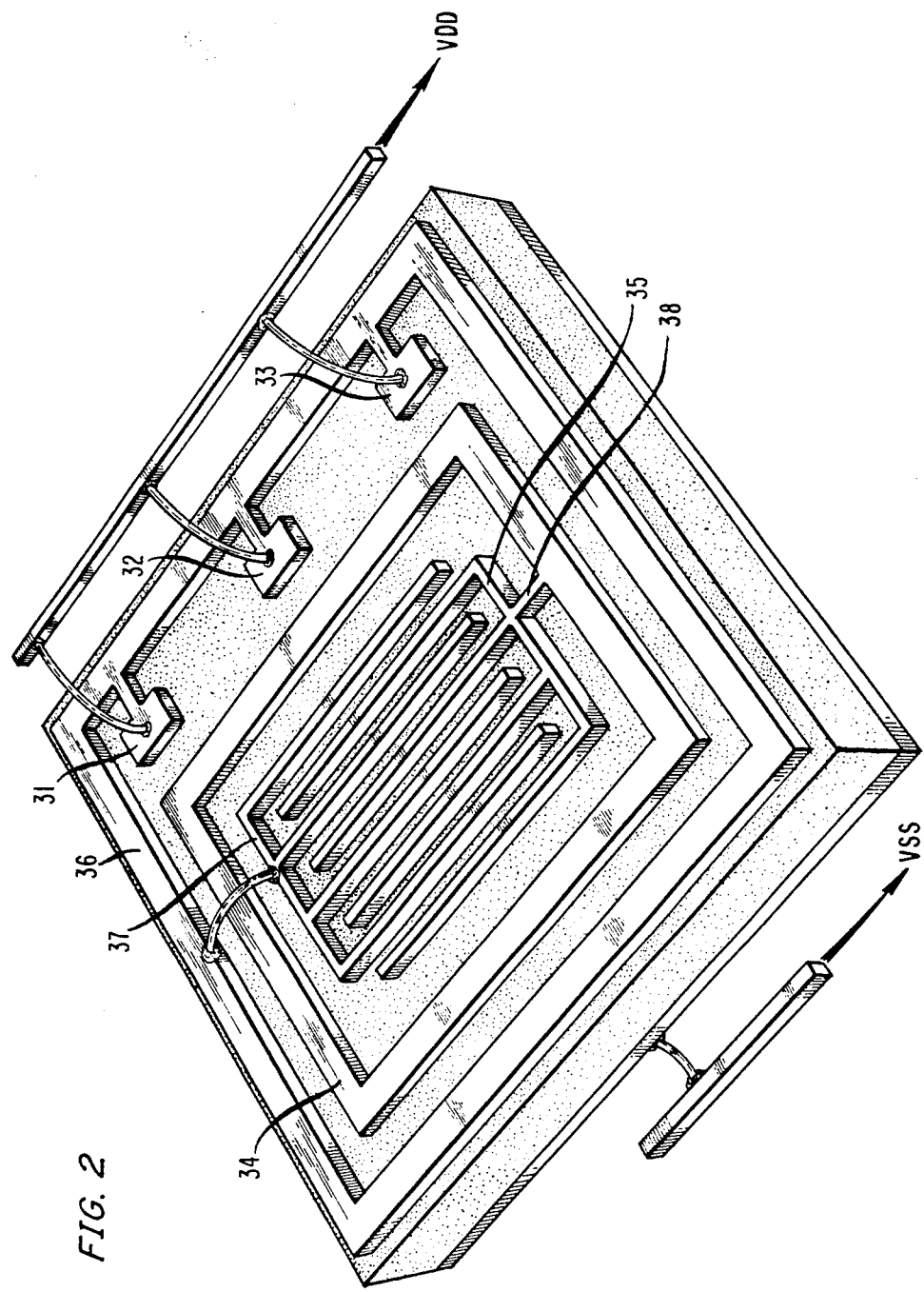
FIG. 2 shows power busses and external power supply connections to an integrated circuit chip that employs the inventive technique.

The present technique thus allows for a reduction in the number of bondpads devoted to power supply conductors. For example, as shown in FIG. 2, only the bondpads connected to $V_{DD}$ (e.g., 31-33) may be needed on the front side (top side as viewed) of the chip. These are typically connected to the "I/O frame $V_{DD}$ bus" 36, which in turn is typically connected to the interior portions of the circuitry through an "interior bus" 37, with various other configurations being possible. On the other hand, in the exemplary embodiment, there may be no $V_{SS}$ bondpads connected to the "I/O frame $V_{SS}$ bus" 34, which is typically connected to the interior circuitry through the interior bus 35. Note however that the present technique need not result in a complete elimination of bondpads for the given power supply voltage. For example, the $V_{SS}$ bus may be split into two (or more) portions, with one or more bondpads connected to the portions that require extra current capacity. In one typical embodiment, the I/O frame bus may still be connected to bondpads, with the interior bus portions then not being connected (as by conductor 38) to the I/O frame bus, but rather relying on the substrate conduction according to the present invention. Note however that even if a given bus is connected to a power supply bondpad, the present technique may still allow a reduction in the number of bondpads required, as compared to the prior are practice of relying solely on current conduction through the bondpads. I estimate that in a typical case, the number of bondpads required for the given power supply voltage that uses the substrate conduction will be less than half the number required by prior art design techniques.

A 32 bit microprocessor, implemented in the 1.25 micrometer CMOS technology noted above, was tested to determine the effectiveness of the present technique. All of the wires to the $V_{SS}$ bondpads were eliminated, and the inventive substrate conduction was relied on for supplying $V_{SS}$ to all of the chip circuitry. Even through the chip employed approximately 200,000 transistors, normal operation was obtained up to several MHz. A computer simulation of the ground bounce noise voltages showed a significant reduction in noise by the use of the inventive technique.

In the exemplary case described herein, a CMOS integrated circuit is formed using the twin-tub process. Other techniques, including single tub (or single "well") techniques are known, and may also be utilized with the present invention. For example, in some cases only the n-tub is present, with the p-channel devices being formed therein, and the n-channel devices being formed in the surrounding portion of the p-type epitaxial layer. In that case, the $V_{SS}$ power supply connection may still be provided through the p+ substrate, by providing a highly doped (p+) contact region in the epitaxial layer and connecting it to the sources of the n channel devices. Note that the epitaxial layer for the single tub case is typically doped more highly than for the twin-tub case, although still much less than the substrate. In most cases utilizing the present technique, the doping level of the epitaxial layer is in the range of $1 \times 10^{14}$ per cm$^3$ to $1 \times 10^{17}$ per cm$^3$, while that of the substrate is typically at least $5 \times 10^{18}$ per cm$^3$. (In the case of the twin-tub process, the epitaxial layer typically has a doping level of less than $1 \times 10^{16}$ per cm$^3$).

Although the conductive layer on the back side of the integrated circuit is typically a metal, other materials (e.g., silicides) are possible. The present technique also offers advantages in terms of electromigration resistance of the power supply conductors. That is, the conductors may be made smaller than in prior art practice, since a portion of the current may be conducted through the substrate according to the inventive technique. Still other variations will be apparent to a person of skill in the art.

I claim:

1. An integrated circuit comprising:
   a semiconductor substrate having a given conductivity type and relatively low resistivity;
   an epitaxial layer formed on the front side of said substrate and having a significantly higher resistivity than that of said substrate;
   at least one doped tub region formed in said epitaxial layer;
   at least one highly doped contact region having said given conductivity type formed in said epitaxial layer;
   and field effect transistors having source regions of the opposite conductivity type formed in said epitaxial layer and connected to said highly doped contact region;
   and further comprises a conductive layer formed on the back side of said substrate, with means for connecting said conductive layer to a power supply voltage,
   characterized in that said integrated circuit has a given number of power supply voltage bondpads on the front side of said substrate for connection to external package terminals, wherein the operation of said integrated circuit requires a number of power supply bondpads greater than said given number but for the flow of current through said conductive layer, said substrate, and said at least one highly doped contact region to said source regions.

2. The integrated circuit of claim 1 wherein at least some of said transistors are supplied with source current in operation solely by said flow of current through said conductive layer and said substrate.

3. The integrated circuit of claim 1 wherein the distance (d) from the bottom of said tub region to the interface between said epitaxial layer and said substrate is less than 15 micrometers.

4. The integrated circuit of claim 1 wherein the distance (d) from the bottom of said tub region to the interface between said epitaxial layer and said substrate is less than 5 micrometers.

5. The integrated circuit of claim 1 wherein the resistivity of said epitaxial layer is greater than 100 times the resistivity of the bulk of said substrate.

6. The integrated circuit of claim 1 wherein the resistivity of said epitaxial layer is greater than 1000 times the resistivity of the bulk of said substrate.

7. The integrated circuit of claim 1 wherein the thickness of said epitaxial layer is no greater than 10 micrometers.

8. The integrated circuit of claim 1 wherein the thickness of said epitaxial layer is less than 5 micrometers.

9. The integrated circuit of claim 1 wherein said given conductivity type is p-type, and said power supply voltage is a negative voltage (e.g., $V_{SS}$).

10. The integrated circuit of claim 9 having no negative power supply voltage bondpads on the front side of said substrate.

11. The integrated circuit of claim 1 wherein said given conductivity type is n-type, and said power supply voltage is a positive voltage (e.g., $V_{DD}$).

12. The integrated circuit of claim 11 having no positive power supply voltage bondpads on the front side of said substrate.

13. The integrated circuit of claim 1 wherein said substrate is silicon.

14. The integrated circuit of claim 13 wherein said epitaxial layer is silicon.

15. The integrated circuit of claim 1 wherein said integrated circuit is a CMOS integrated circuit.

16. The integrated circuit of claim 1 wherein said at least one tub region has said given conductivity type, with said at least one highly doped contact region also having said given conductivity type, and wherein said field effect transistors having source regions of the opposite conductivity type are located in said tub region.

17. The integrated circuit of claim 16 further comprising at least one tub region of said opposite conductivity type formed in said epitaxial layer, and further comprising transistors having source regions of said given conductivity type being located therein.

18. The integrated circuit of claim 1 wherein said at least one tub region extends down to the interface of said epitaxial layer and said substrate.

19. The integrated circuit of claim 1 wherein said epitaxial layer has said given conductivity type.

* * * * *